United States Patent [19]
Komura et al.

[11] Patent Number: 6,021,025
[45] Date of Patent: Feb. 1, 2000

[54] DISK APPARATUS HAVING AN ACTUATOR FOR MOVING HEADS

[75] Inventors: Yukihiro Komura; Yoshiaki Nagasawa; Masahide Kanegae; Hajime Miura, all of Kawasaki, Japan

[73] Assignee: Fujitsu Limited, Kawasaki, Japan

[21] Appl. No.: 08/824,167

[22] Filed: Mar. 26, 1997

[30] Foreign Application Priority Data

Jun. 14, 1996 [JP] Japan .................................. 8-154194

[51] Int. Cl.⁷ .................................................. G11B 21/08
[52] U.S. Cl. ............................................................ 360/106
[58] Field of Search .................................. 360/104–107

[56] References Cited

U.S. PATENT DOCUMENTS

| | | | |
|---|---|---|---|
| 5,095,396 | 3/1992 | Putnam et al. | 360/106 |
| 5,121,273 | 6/1992 | Slezak | 360/104 |
| 5,130,895 | 7/1992 | Somemiya et al. | 360/106 |
| 5,668,684 | 9/1997 | Palmer et al. | 360/106 |

FOREIGN PATENT DOCUMENTS

| | | |
|---|---|---|
| 2177075 | 7/1990 | Japan . |
| 394617 | 9/1991 | Japan . |
| 469803 | 3/1992 | Japan . |
| 554622 | 3/1993 | Japan . |
| 6259953 | 9/1994 | Japan . |
| 684515 | 12/1994 | Japan . |
| 8-106617 | 4/1996 | Japan . |

OTHER PUBLICATIONS

IBM Technical Disclosure Bulletin (vol. 25, No. 5, Oct. 1982).

*Primary Examiner*—Allen T. Cao
*Attorney, Agent, or Firm*—Greer, Burns & Crain, Ltd.

[57] ABSTRACT

An actuator for moving heads in a disk unit having heads for reading or writing data from or on recording surfaces of disks driven to rotate, an actuator having arms for supporting the heads, a main FPC board having one end thereof supported by the actuator and the other end thereof supported by a body of the disk unit, and relay FPC boards placed along the arms of the actuator, which can realize a compact and thin size, resistive to noise, and permitting a reduction in manufacturing cost. A printed-circuit board is supported by an actuator, is electrically connected to a circuit unit in a body of a disk unit via a main FPC board, and is electrically connected to heads via relay FPC boards. Integrated circuits are mounted on the printed-circuit board.

8 Claims, 12 Drawing Sheets

DISK APPARATUS HAVING AN ACTUATOR FOR MOVING HEADS

BACKGROUND OF THE INVENTION

1. Field of the Invention

The present invention relates to an actuator for moving heads in a disk unit. More particularly, the present invention relates to the structure of an actuator having mounted thereon a control circuit for processing head signals to be exchanged with heads.

2. Description of the Related Art

In recent years, the trend of disk units including a magnetic disk unit has been towards compact and thin units in terms of shape and large units in terms of storage capacity. This leads to smaller heads and a lower signal level. A countermeasure against noise has been needed. Moreover, a lower cost is demanded.

Since the signal level for heads has decreased because of the smaller shape of the heads, it is necessary, for ensuring reliability of the heads against noise, to arrange a head integrated circuit (IC) for changing heads for reading and writing or amplifying read signals, a servo IC for amplifying read servo signals (the servo IC is included only when head positioning is performed by servo-surface servo, and replaced with the head IC when the positioning is performed by data-surface servo), and peripheral chips (parts) containing resistors, capacitors, and the like necessary for the ICs in the vicinity of the heads.

The head IC, servo IC, and peripheral chips are therefore mounted on an FPC (main FPC) sheet on the actuator located in the vicinity of the heads (refer to, for example, Japanese Unexamined Patent Publication No. 2-177075).

However, since a mounting area on the actuator is limited, part of the peripheral chips cannot, at present, be mounted on the main FPC sheet on the actuator, though an anti-noise characteristic is deteriorated. For solving this problem, the main FPC sheet is folded on the actuator in order to increase the mounting area.

For realizing a compact and thin disk unit, as already known, signal transfer among the heads, head IC, and servo IC is not achieved over leads (wires) but achieved via FPC sheets (relay FPC sheets).

In the structure in which the main FPC sheet is folded in order to expand the mounting area, a member for retaining the main FPC sheet in the folded state is needed, assembling work becomes more time-consuming, and manufacturing cost increases. Besides, there are problems that the anti-noise characteristic deteriorates with extension of signal transmission paths and that the increase in thickness of the main FPC sheet contradicts the trend toward a compact and thin shape.

With the employment of the relay FPC sheets, the portion of a disk unit in which the relay FPC sheet is employed can be made thinner. However, an area occupied by bonding lands is so large that a mounting area required for the head IC, servo IC, peripheral chips, and the like gets narrower. Thus, the known structure makes the problems more serious.

SUMMARY OF THE INVENTION

The first object of the present invention is to realize a disk unit capable of being made compact and thin, resistive to noises, and permitting a reduction in manufacturing cost.

The second object of the present invention is to realize a disk unit not only making it possible to accomplish the first object but also facilitating heat dissipation from integrated circuits mounted on an actuator.

The third object of the present invention is to realize a disk unit making it possible not only to accomplish the first object but also to reliably ground a main FPC sheet.

According to the present invention there is provided an actuator for moving heads in a disk unit comprising: disks; a disk drive for driving and rotating the disks; heads for reading or writing data from or on recording surfaces of the disks; an actuator having arms for supporting the heads; an actuator drive for driving the actuator so that the heads move in a direction in which the heads traverse tracks on the disks; a main FPC sheet having one end thereof supported by the actuator and the other end thereof supported by a body of the disk unit, and bending with oscillation of the actuator; relay FPC sheets placed along the arms of the actuator; a printed-circuit board supported by the actuator, electrically connected to a circuit unit in the body of the disk unit via the main FPC sheet, and electrically connected to the heads via the relay FPC sheets; and integrated circuits, mounted on the printed-circuit board, for processing at least signals read by the heads and sending the resultant signals to the circuit unit in the body of the disk unit.

According to the foregoing configuration, the printed-circuit board is intended to be supported by the actuator, electrically connected to the circuit unit in the body of the disk unit via the main FPC sheet, and electrically connected to the heads via the relay FPC sheets. The integrated circuits are mounted on the printed-circuit board. Since it is easy to form patterns in a multilayered form at high density so as to produce a multilayered printed-wiring board, a mounting area can be expanded substantially. This obviates the necessity of folding the main FPC sheet for the purpose of expanding the mounting area.

Moreover, the rigidity of a printed-circuit board can be improved. The work of mounting integrated circuits on the printed-circuit board is simple. According to the above configuration, therefore, a part for retaining the main FPC sheet in a folded state becomes unnecessary, assembling work is simplified, and manufacturing cost can be reduced.

Moreover, since the main FPC sheet is not folded, signal transmission paths can be shortened. Furthermore, since the employment of the printed-circuit board enables substantial expansion of the mounting area, a larger number of peripheral chips and the like can be mounted on the printed-circuit board on the actuator. This leads to an improved anti-noise characteristic. Furthermore, a shield layer or the like can be formed readily on the printed-circuit board. Even from this viewpoint, the anti-noise characteristic can be improved.

Herein, the adoption of a ceramic substrate as the printed-circuit board makes it possible to improve heat dissipation efficiency, and to minimize the occurrence of dust which is critical to the disk unit.

Arrangements described below are conceivable as the arrangement of the main FPC sheet, relay FPC sheets, and printed-circuit board.

<1> An FPC sheet having lands for electrical connection formed along an edge thereof is used as the main FPC sheet. FPC sheets having lands to be joined with the lands on the main FPC sheet formed are used as the relay FPC sheets. The printed-circuit board is placed on the main FPC sheet. This results in a structure in which the relay FPC sheets and main FPC sheet which are all flat are connected mutually and the printed-circuit board is placed on the main FPC sheet. Assembling becomes simple. This leads to a reduction in manufacturing cost.

In the case of the arrangement, if an end of the main FPC sheet is extended to lie over the arms of the actuator, a mounting area on the main FPC sheet can be expanded. As a result, the mounting area of the printed-circuit board can be widened.

<2> FPC sheets having lands for electrical connection with the printed-circuit board formed are used as the main FPC sheet and relay FPC sheets. A printed-circuit board having lands to be joined with the lands on the relay FPC sheets formed on a surface thereof on which integrated circuits are mounted, and having lands to be joined with the lands on the main FPC sheet formed on a surface thereof opposite to the surface on which the integrated circuits are mounted is used as the printed-circuit board. Compared with the arrangement <1> in which the relay FPC sheets and printed-circuit board are juxtaposed on the main FPC sheet, a wider printed-circuit board can be employed.

<3> FPC sheets having lands for electrical connection with the printed-circuit board formed are used as the main FPC sheet and relay FPC sheets. A printed-circuit board having lands to be joined with the lands on the main FPC sheet and relay FPC sheets formed on a surface thereof opposite to a surface on which integrated circuits are mounted is used as the printed-circuit board. In this case, compared with the arrangement <2>, the mounting area of the printed-circuit board can be further widened.

<4> In the arrangement <3>, if the printed-circuit board is placed so that the surface thereof on which integrated circuits are mounted is opposed to the face of the actuator, since the relay FPC sheets are located on the face side of the actuator, even if one of the heads or relay FPC sheets is found defective, the head or relay FPC sheet can be separated easily. Eventually, the workability in assembling or maintenance can be improved.

<5> In the arrangement <4>, if a gap between the integrated circuits and the surface of the actuator is filled with a material of high heat conductivity, heat generated by the integrated circuits can be dissipated efficiently, and a failure or the like in an integrated circuit caused by a temperature rise can be avoided. This obviates the necessity of including a special heat dissipation part, thus contributing to a reduction in manufacturing cost.

<6> If a grounded land is formed on the main FPC sheet and brought into contact with the surface of the actuator, grounding can be achieved reliably at low cost. This leads to a reduction in manufacturing cost.

BRIEF DESCRIPTION OF THE DRAWINGS

The present invention will be more clearly understood from the description as set forth below with reference to the accompanying drawings, wherein:

FIG. 8A shows a state in which components are not assembled, and FIG. 8B shows a state in which the components are assembled;

FIG. 9A shows a state in which components are not assembled, and FIG. 9B shows a state in which the components are assembled;

FIG. 10A shows a state in which components are not assembled, and FIG. 10B shows a state in which the components are assembled;

DESCRIPTION OF THE PREFERRED EMBODIMENTS

Embodiments of the present invention will be described in conjunction with the drawings.

(First Embodiment)

Figure 1:
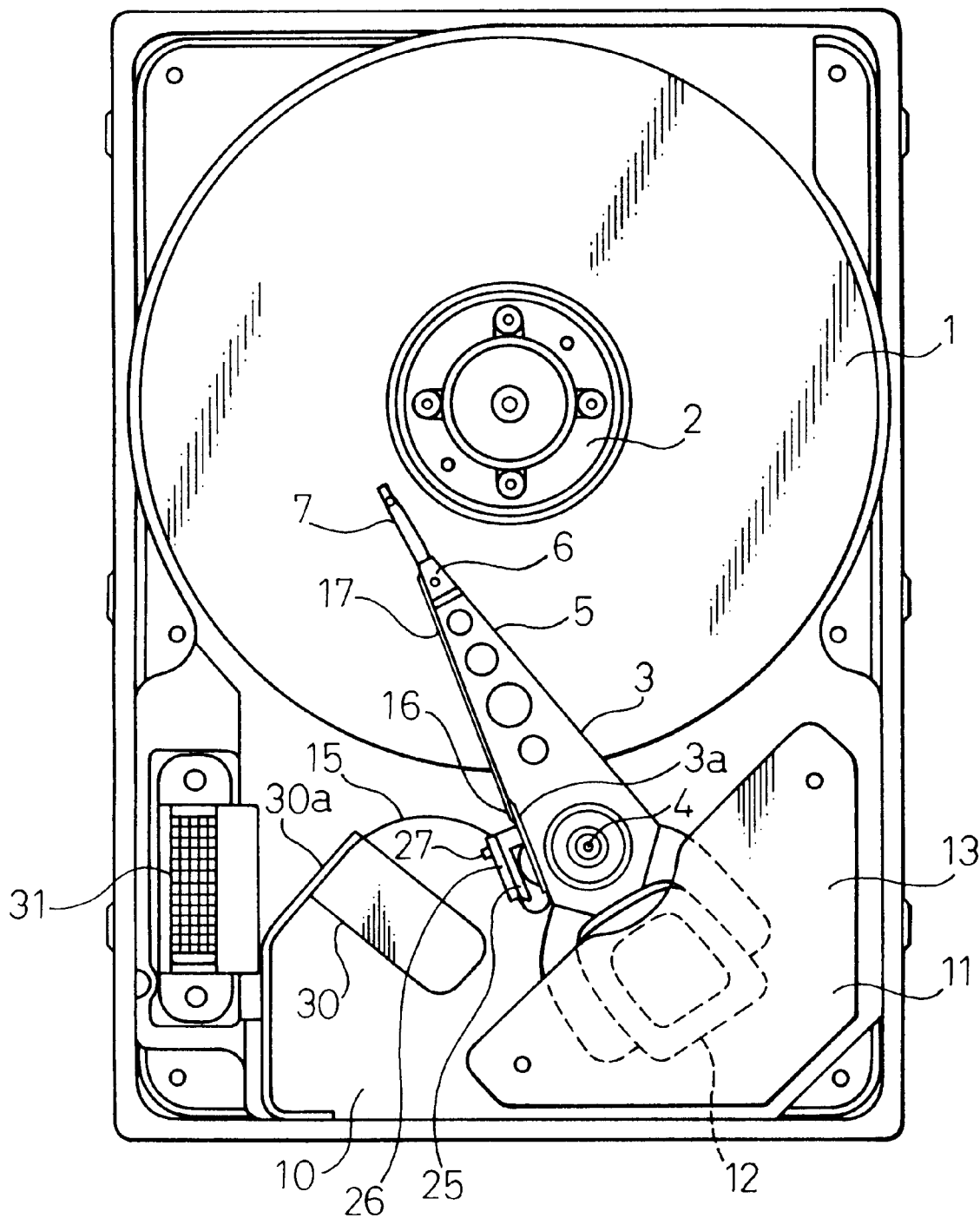
FIG. 1 is a plan view showing the first embodiment of the present invention with a cover removed.
Figure 2:
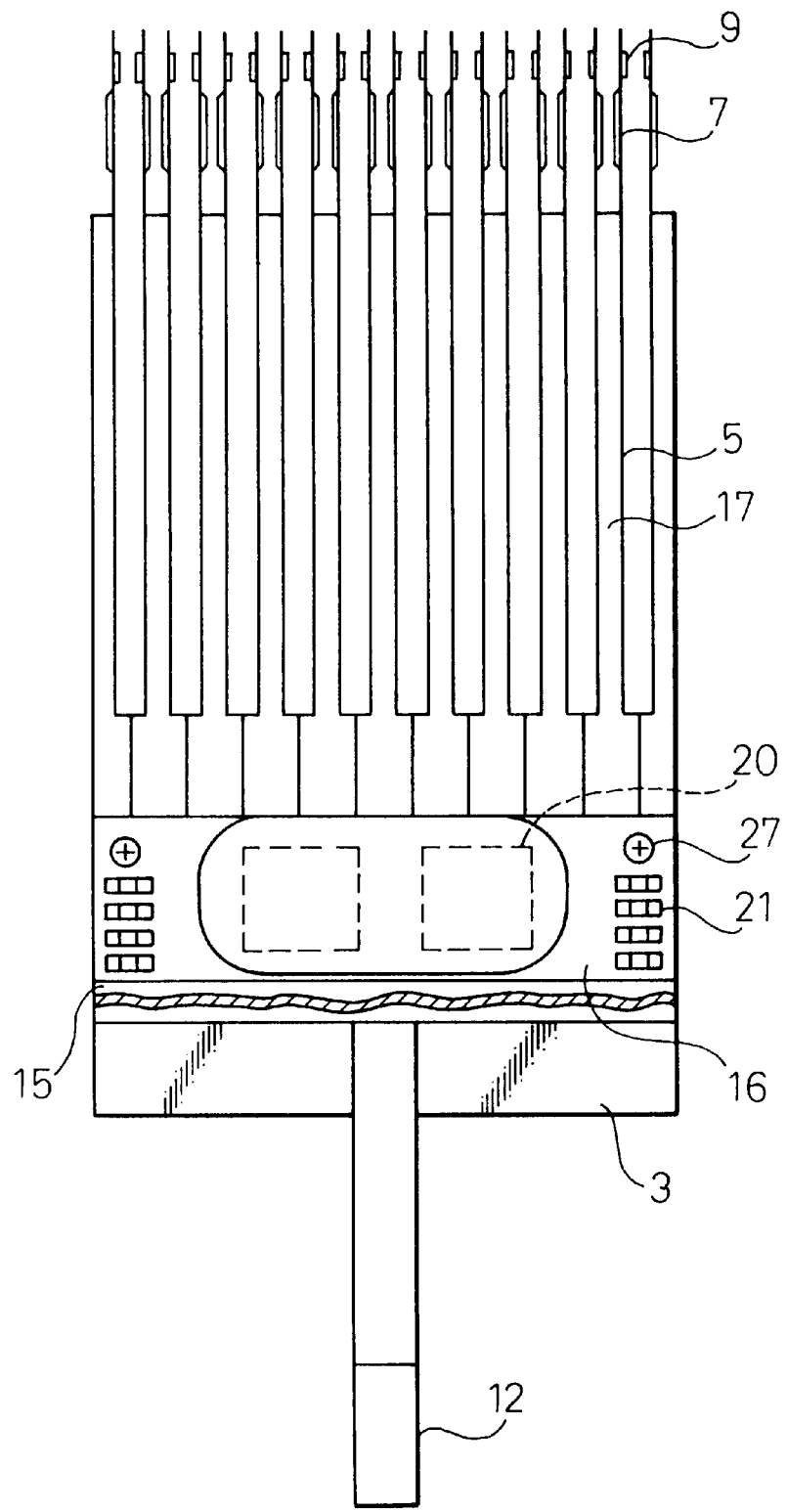
FIG. 2 is a side view showing the arrangement of an actuator and its surroundings shown in FIG. 1.

FIG. 1 is a plan view showing the first embodiment of the present invention, relating to an actuator for moving heads in a magnetic disk unit, with a cover removed, and FIG. 2 is a side view showing the arrangement of an actuator and its surroundings shown in FIG. 1.

In the drawings, disks (magnetic disks) 1 are layered coaxially at intervals of a certain gap in a vertical direction with recording surfaces thereof set face to face, and driven to rotate by a spindle motor 2 serving as a disk drive. An actuator 3 is supported on a base plate 10 by a shaft 4 located in the vicinity of the outer circumferences of the disks 1 so that the actuator 3 can rotate.

The actuator 3 has arms 5 extending over the recording surfaces of the disks 1 so as to support magnetic heads for reading or writing data from or on the recording surfaces of the disks 1. Suspensions 7 are, as also shown in FIGS. 3 and 4, attached to the tips of the arms 5 via spacers 6.

Figure 3:
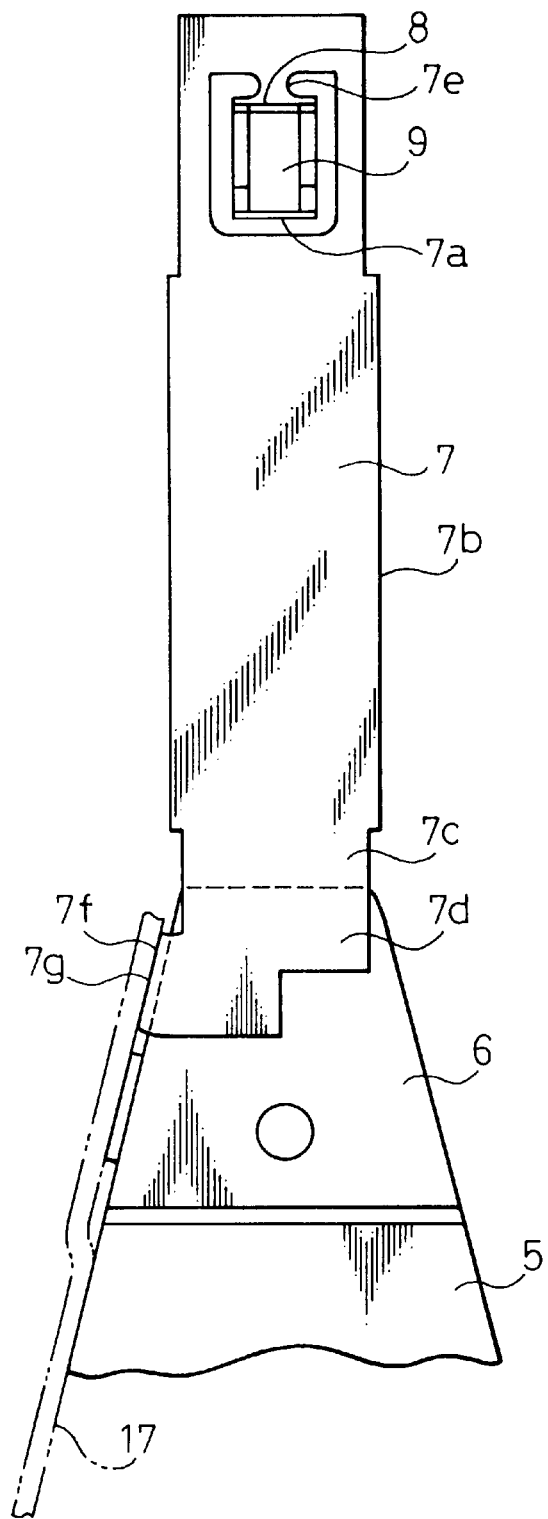
FIG. 3 is a partially enlarged plan view showing the arrangement of an arm located in the middle of FIG. 2 and its surroundings.
Figure 4:
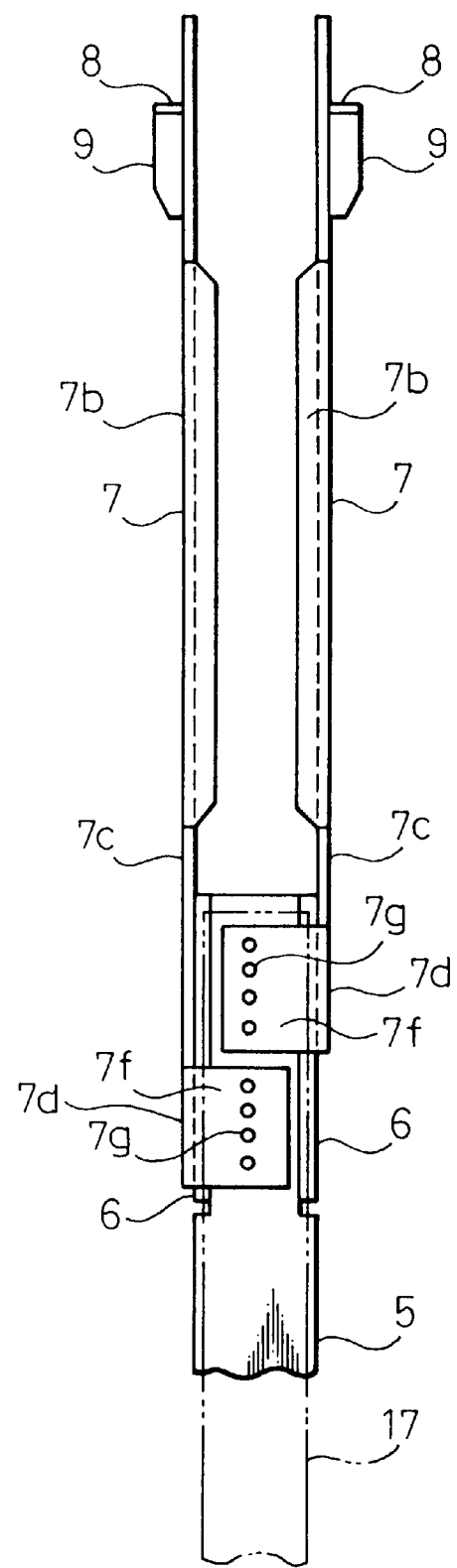
FIG. 4 is a partially enlarged side view showing the arrangement of the arm located in the middle of FIG. 2 and its surroundings.

FIG. 3 is a plan view showing the arrangement of an arm 5 located in the middle of FIG. 2 and its surroundings, and FIG. 4 is a side view of the arrangement. In the drawings, a suspension 7 is secured to a spacer 6 by spot welding or the like. The spacer 6 is fixed to the arm 5 by caulking or gluing.

The suspension 7 is made by machining a thin plate member made of stainless steel or the like a given plane form and then folding it. The suspension 7 includes a slider support 7a for supporting a slider 9 having a magnetic head 8 serving as a head for reading or writing data mounted, a rib section 7b having ribs formed on edges thereof for the purpose of improving rigidity, a spring section 7c adjoining the rib section 7b, and a fixture section 7d adjoining the spring section 7c and fixed to the spacer 6.

The slider support 7a provided as the distal part of the suspension 7 is, in this embodiment, formed inside a notched hole bored substantially like letter U and coupled to the body of the suspension 7 via a gimbal spring 7e of low rigidity.

A routing pattern that is not shown is formed on the surface of the suspension 7. One end of the routing pattern extends to the slider support 7a and forms lands for electrical connection with the magnetic head 8. The other end thereof extends to a terminal section 7f made by folding the fixture section 7d and forms lands 7g for electrical connection.

In this embodiment, an MR head element is used as a head element for reading of the magnetic head 8, and a thin-film head element is used as a head element for writing thereof. The number of lines extending from the routing pattern to the one magnetic head 8 is four, and the corresponding number of lands are formed.

The slider 9 has lands formed at positions opposed to the lands on the slider support 7a. Both the lands are joined, whereby electrical connections between the magnetic head 8 and routing pattern and mechanical coupling between the slider 9 and slider support 7a are achieved simultaneously.

In this embodiment, one magnetic head 8 is opposed to one recording surface of each disk 1. Arms 5 located at the uppermost and lowermost positions are each provided with one suspension 7. Arms 5 located intermediately are each provided with two suspensions 7.

An actuator drive 11 for driving the actuator 3 is located in a direction opposite to a direction in which the arms 5 of the actuator 3 are extended so that the magnetic heads 8 can move in a direction in which they traverse tracks on the disks 1. The actuator drive 11 is formed with a moving coil type linear motor (voice coil motor (VCM)) and includes a coil 12 located at a position relative to which the actuator 3 pivots, and a magnetic circuit 13 located on the base plate 10 and composed of a magnet and yoke. The coil 12 is located in a magnetic gap of the magnetic circuit 13.

Figure 5:
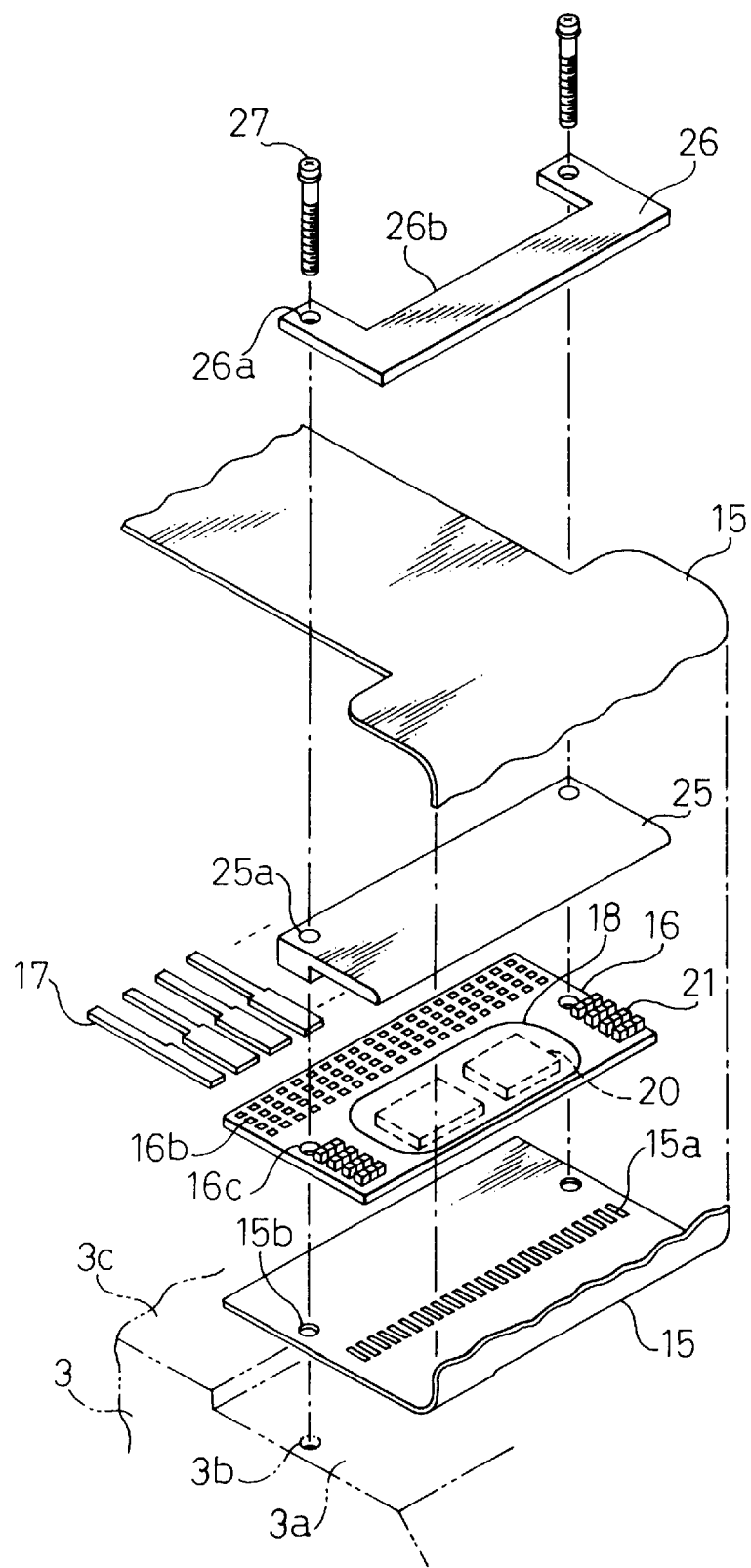
FIG. 5 is an exploded view concerning connections among a main FPC sheet, relay FPC sheets, and a printed-circuit board on the actuator.

The structure of part of the actuator 3 near the center of rotation thereof will be described in detail in conjunction with FIGS. 1 and 5. A concave part 3a or a stepped part is formed on a flank of the part of the actuator 3 near the center of rotation thereof. The printed-circuit board 16 is placed in the concave part 3a with on end of the main FPC sheet 15 between them. The other end of the main FPC sheet 15 is supported by the body of the disk unit (base plate 10). The intermediate part of the main FPC sheet 15 therefore bends with oscillation of the actuator 3.

Figure 6:
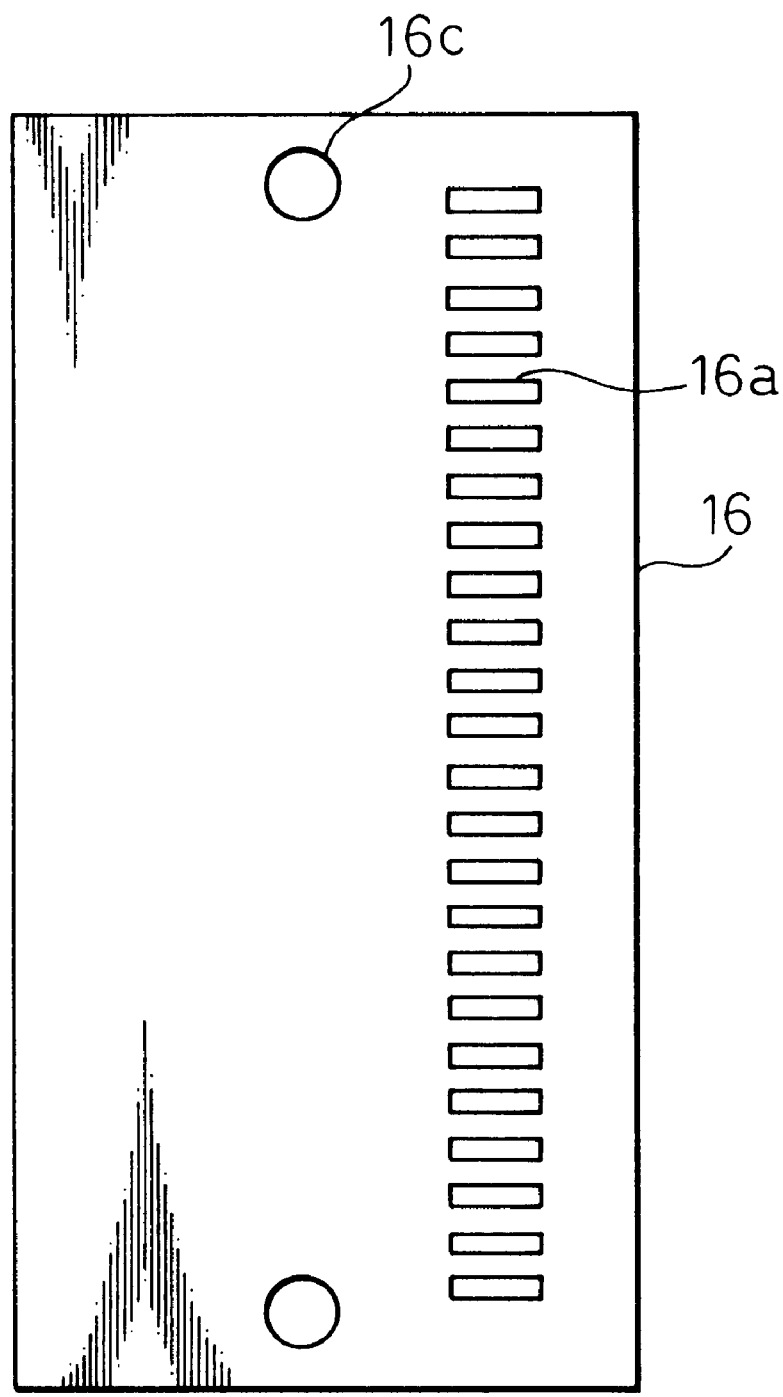
FIG. 6 is a plan view showing a surface of the printed-circuit board opposite to a mounting surface thereof.

The printed-circuit board 16 is electrically connected to a circuit unit (not shown) in the body of the disk unit via the main FPC sheet 15. Lands 15a for electrical connection are formed on a surface of the main FPC sheet 15 opposite to the actuator 3. Lands 16a are, as shown in FIG. 6, formed at positions opposed to the lands 15 on the main FPC sheet 15 on a surface of the printed-circuit board 16 on the side of the actuator 3. Both the lands 15a and 16a are joined according to a method such as thermocompression bonding, whereby electrical connection and mechanical coupling between the printed-circuit board 16 and main FPC sheet 15 are achieved.

Figure 7:
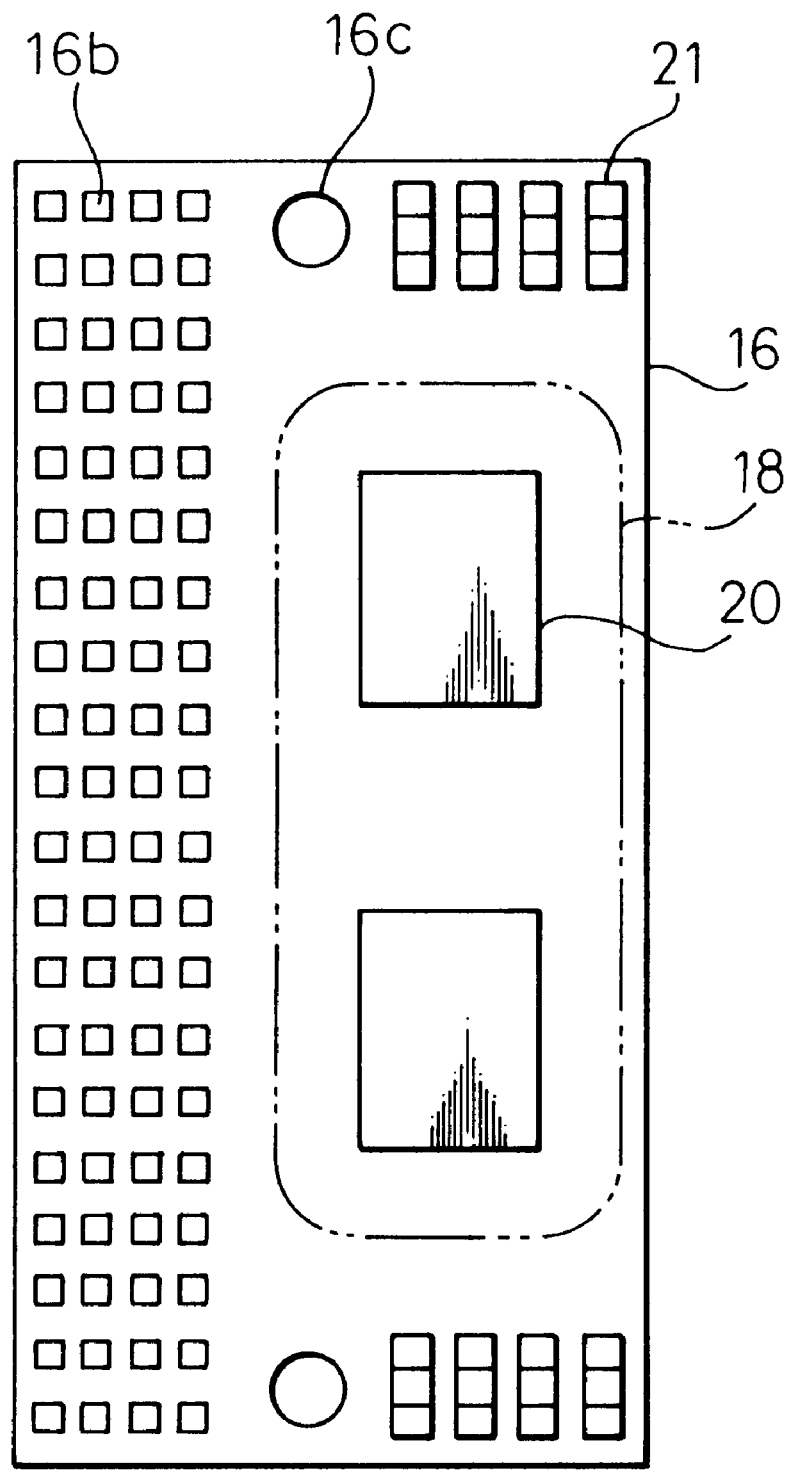
FIG. 7 is a plan view showing the mounting surface of the printed-circuit board.

The printed-circuit board 16 is electrically connected to the magnetic heads 8 via relay FPC sheets attached to the arms 5 of the actuator 3 using an adhesive. Lands 17b (not shown but shown in FIG. 8 relating to another embodiment to be described later) are formed on surfaces of one end of the relay FPC sheets 17 on the side of the actuator 3. Lands 16b are, as shown in FIG. 7, formed at positions opposed to the lands 17b on the relay FPC sheets 15 on a surface of the printed-circuit board 16 opposite to the actuator 3.

Both the lands 17b and 16b are joined according to a method such as thermocompression bonding, whereby electrical connection and mechanical coupling between the printed-circuit board 16 and relay FPC sheets 17 are achieved. Lands for electrical connection which are not shown are formed on surfaces of the other ends of the relay FPC sheets 17 on the side of the actuator 3. The lands are joined with the lands 7g on the terminal sections 7f of the suspensions 7.

Integrated circuits 20 for changing the magnetic heads 8, amplifying read signals, and the like (head IC) (in this embodiment, a servo IC is unused because head positioning is performed by data-surface servo) and peripheral chips 21 containing capacitors and the like necessary for the integrated circuits 20 are mounted on the printed-circuit board 16.

In this embodiment, resistors are formed with a film coated on the printed-circuit board 16. The integrated circuits 20 are mounted by chip-on-board (COB). Specifically, bare chips including a head IC are mounted directly on the printed-circuit board 16 and then coated with a protective film 18.

On the mounting surface of the printed-circuit board 16, a lower presser board 25 made of stainless steel, aluminum, plastic, or resin is layered in such a way that the lower presser board 25 will not come into contact with the integrated circuits 20 and peripheral chips 21. An upper presser board 26 is stacked on the lower presser board 25 with the folded part of the main FPC sheet 15 between them. The upper presser board 26 has a notch 26b in which the main FPC sheet 15 can be fitted.

A through hole 26a in the upper presser board 26, a through hole 25a in the lower presser board 25, a through hole 16c in the printed-circuit board 16, and a through hole 15b in the main FPC sheet 15 are bored coaxially. A locking screw 27 is fixed to a screw hole 3b of the actuator 3 through the through holes.

The depth of the concave part 3a of the actuator 3 is determined so that the relay FPC sheets 17 can lie closely to a surface 3c of the actuator 3 in the foregoing layered and fixed state attained by the screw 27. The relay FPC sheets 17 are attached to the actuator 3 substantially linearly using an adhesive.

The concave part 3a also plays a role in adjusting for an imbalance of the actuator 3 caused by mounting the printed-circuit board 16 on the actuator 3. In other words, the actuator 3 is balanced in weight through an increase in weight caused by mounting the printed-circuit board 16 and a decrease in weight caused by forming the concave part 3.

The main FPC sheet 15 is supported by the body of the disk unit as follows: the main FPC sheet 15 is attached to a leading part 30a of a supporting member 30 fixed to the base plate 10 using an adhesive or the like, and then connected to a connector 31 fixed to the base plate 10.

The connector 31 is designed to transfer signals between the inside and outside of a disk enclosure (in which the base plate 10 is included), that is, to transfer signals between the integrated circuits 20 and the circuit unit in the body of the disk unit.

Lines linking the main FPC sheet 15 and the circuit unit in the body of the disk unit include a line for supplying power to the integrated circuits 20, a line for supplying a chip select signal indicating which of the plurality of integrated circuits 20 is selected, a line for supplying a head select signal indicating which of the plurality of heads handled by each integrated circuit is selected, signal lines for input/output data relative to the heads, and a signal line used to change reading and writing modes.

The operation of the foregoing embodiment will be described. When the disks 1 are driven by the spindle motor 2 and rotating at a high speed, the sliders 9 receive air flows stemming from the rotation. The magnetic heads 8 therefore fly a microscopic height above the disk surfaces. In this state, when the actuator drive 11 drives the actuator 3, the actuator 3 oscillates. This causes a magnetic head 8 to move to an intended track on a disk 1. Consequently, data can be read or written from or on the disk 1.

A selection signal indicating from or on which disk 1 data is read or written is sent from the circuit unit in the body of the main unit to the integrated circuits 20 via the main FPC sheet 15. In response to the signal, the integrated circuits 20 drive a desired magnetic head 8 via a relay FPC sheet 17, whereby data is read or written from or on the disk 1. A signal acquired by the magnetic head 8 is processed (for example, amplified) by the integrated circuits 20 and sent to the circuit unit in the body of the main unit via the main FPC sheet 15.

According to the foregoing configuration, the printed-circuit board 16 is installed to be supported by the actuator 3, electrically connected to the circuit unit in the body of the disk unit via the main FPC sheet 15, and electrically connected to the magnetic head 8 via the relay FPC sheets 17. The integrated circuits 20 are mounted on the printed-circuit board 16. Incidentally, it is easy to form patterns on the printed-circuit board 16 in a multilayered form at high density so as to produce a multilayered printed-wiring board.

The foregoing configuration makes it possible to substantially expand a mounting area. It becomes unnecessary to fold the main FPC sheet 15 for the purpose of expanding the mounting area. Moreover, the rigidity of the printed-circuit board 16 can be improved. The work of mounting the integrated circuits on the printed-circuit board 16 is simple. According to the foregoing configuration, therefore, a part for retaining the main FPC sheet 15 in a folded state becomes unnecessary, and assembling work is simplified. Eventually, the manufacturing cost can be reduced.

Since the main FPC sheet 15 is not folded, signal transmission paths can be shortened. Moreover, since the employment of the printed-circuit board 16 leads to substantial expansion of a mounting area, a larger number of peripheral chips 21 can be mounted on the printed-circuit board 16 on the actuator 3. Consequently, an anti-noise characteristic can be improved. Moreover, a shield layer or the like can be formed readily on the printed-circuit board 16. Even from this viewpoint, the anti-noise characteristic can be improved.

In the foregoing embodiment, lands to be joined with the lands on the relay FPC sheets 17 are formed on a surface of the printed-circuit board 16 on which the integrated circuits 20 are mounted. Lands to be joined with the lands on the main FPC sheet 15 are formed on another surface of the printed-circuit board 16 opposite to the surface thereof on which the integrated circuits 20 are mounted. Compared with the arrangement in which the relay FPC sheet 17 and printed-circuit board 16 are juxtaposed on the main FPC sheet 15, a wider printed-circuit board can be employed as the printed-circuit board 16. This leads to an expanded mounting area.

Herein, a ceramic substrate that is excellent in heat conductivity and can reduce the occurrence of dust is used as the printed-circuit board 16. The foregoing embodiment is a magnetic disk unit composed of a plurality of disks. The present invention is not limited to the magnetic disk unit but may be adapted to a disk unit having only one disk.

Various structures and arrangements are available for the structures and arrangement of a main FPC sheet, relay FPC sheets, and a printed-circuit board. The present invention is not limited to the aforesaid embodiment. Other embodiments will be described as the second and subsequent embodiments.

(Second Embodiment)

Figure 8A:
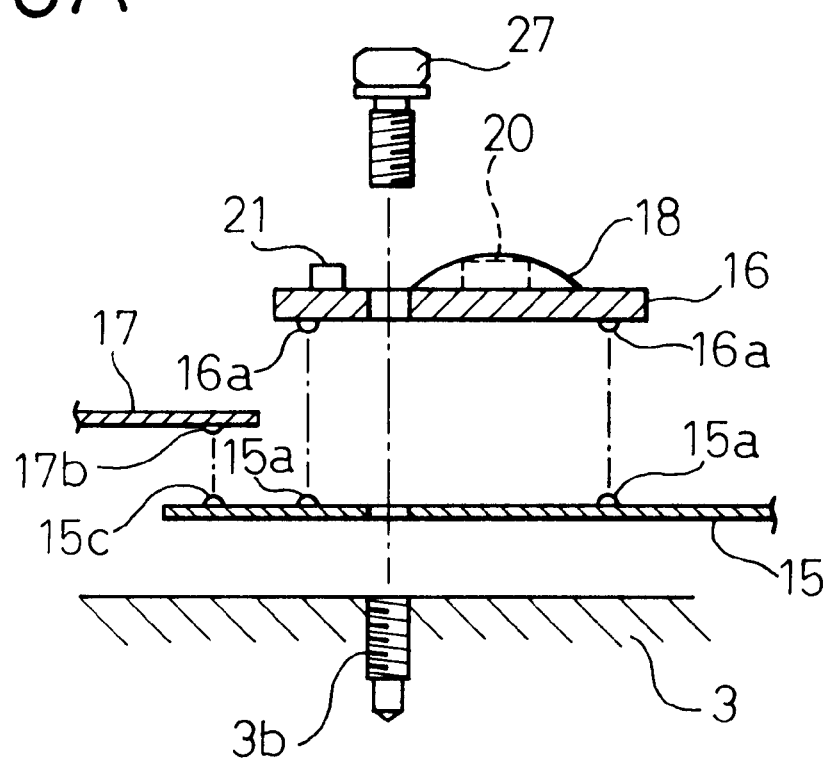
FIGS. 8A and 8B are sectional views showing a structure in the second embodiment.
Figure 8B:
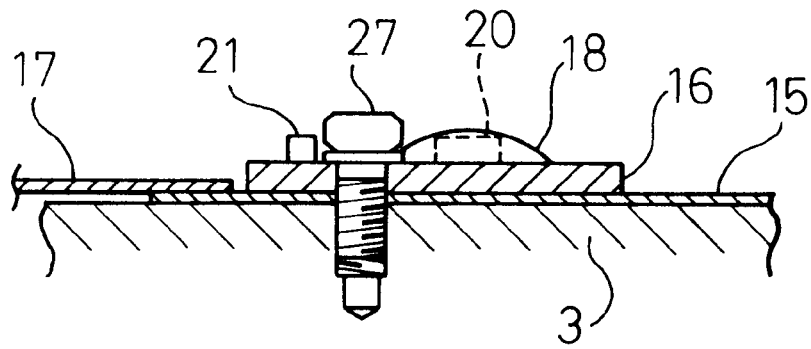

FIGS. 8A and 8B show the second embodiment relating to an actuator for moving heads in a magnetic disk unit, conceptually illustrating a major portion thereof alone. In the drawing, parts corresponding to those of the first embodiment are assigned the same reference numerals. The upper presser board, lower presser board, and the like are omitted. FIG. 8A shows a state in which components are not assembled, and FIG. 8B shows a state in which the components are assembled.

In the second embodiment, an FPC sheet having lands 15c, which are different from the lands 15a, formed along an edge thereof is used as the main FPC sheet 15. The lands 17b on the relay FPC sheets 17 are joined with the lands 15c on the main FPC sheet. Only the main FPC sheet 15 is connected to the printed-circuit board 16.

According to the configuration, such a structure insures that: the relay FPC sheets 17 and main FPC sheet 15, which are all flat, are connected to one another; and the printed-circuit board 16 is placed on the main FPC sheet 15. Consequently, assembly is simplified. This leads to a reduction in manufacturing cost. In this configuration, if one end of the main FPC sheet 15 is extended over the arms 5 of the actuator 3, the mounting area on the main FPC sheet 15 can be expanded. As a result, the mounting area on the printed-circuit board 16 can be widened.

(Third Embodiment)

Figure 9A:
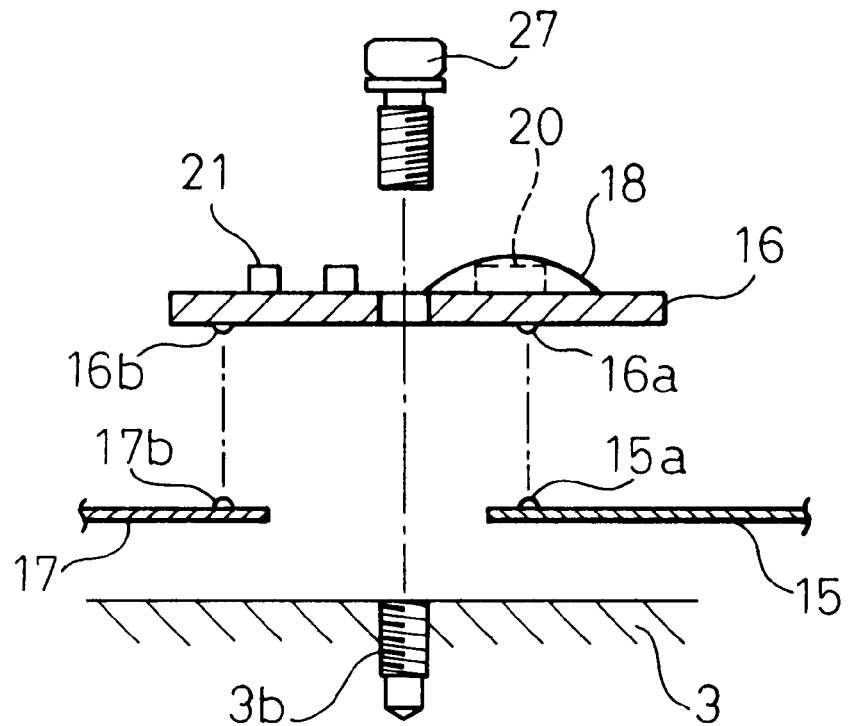
FIGS. 9A and 9B are sectional views showing a structure in the third embodiment.
Figure 9B:
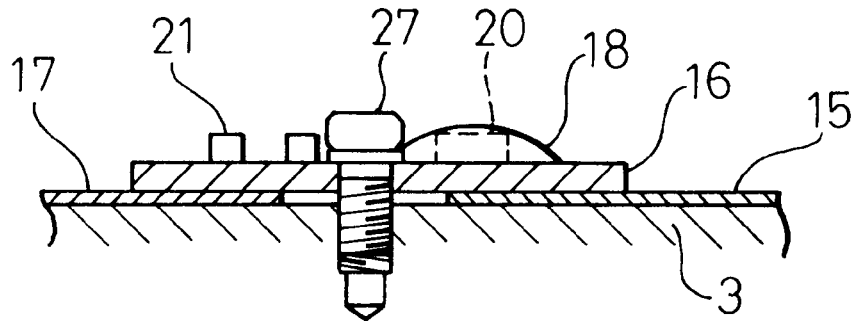

FIGS. 9A and 9B show the third embodiment relating to an actuator for moving heads in a magnetic disk unit, conceptually illustrating a major portion thereof alone. In the drawings, parts corresponding to those of the first embodiment are assigned the same reference numerals. The upper presser board, lower presser board, and the like are omitted. FIG. 9A shows a state in which components are not assembled, while FIG. 9B shows a state in which the components are assembled.

In the third embodiment, the lands 16a and 16b on the printed-circuit board 16 to be joined with the lands 15a on the main FPC sheet 17 and the lands 17b on the relay FPC sheets 17 respectively are formed on a surface of the printed-circuit board 16 opposite to the surface thereof on which the integrated circuits 20 are mounted. According to this configuration, the lands 16a and 16b disappear from the mounting surface of the printed-circuit board 16. Compared with the configuration of the first embodiment, the mounting area of the printed-circuit board 16 can further be widened.

(Fourth Embodiment)

Figure 10A:
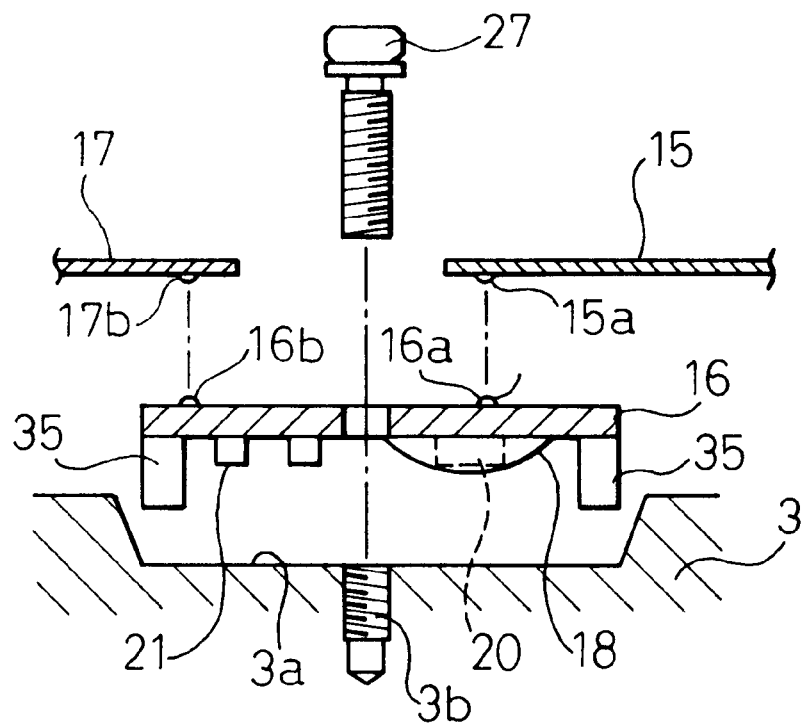
FIGS. 10A and 10B are sectional views showing a structure in the fourth embodiment.
Figure 10B:
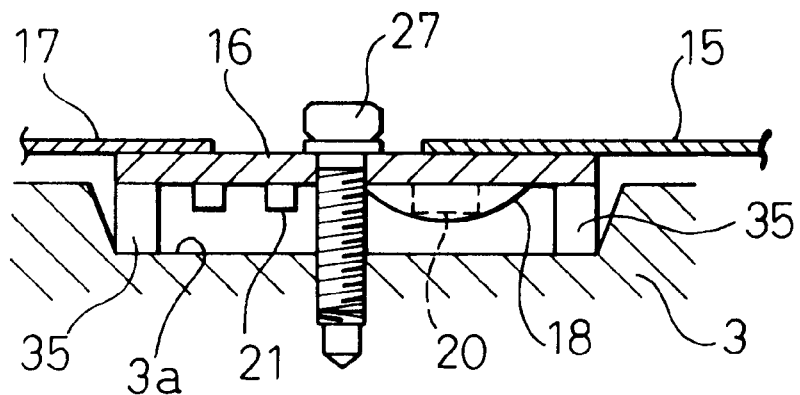

FIGS. 10A and 10B show the fourth embodiment relating to an actuator for moving heads in a magnetic disk unit, conceptually illustrating a major portion thereof alone. In the drawings, parts corresponding to those of the first embodiment are assigned the same reference numerals. The upper presser board, lower presser board, and the like are omitted. FIG. 10A shows a state in which components are not assembled, while FIG. 10B shows a state in which the components are assembled.

The fourth embodiment is based on the configuration of the third embodiment, wherein the printed-circuit board 16 is placed so that the surface of the printed-circuit board 16 on which the integrated circuits 20 are mounted is opposed to the face of the concave part 3a of the actuator 3. With this configuration, the relay FPC sheets 17 are located on the face side of the actuator 3. Therefore, even if one of the magnetic heads 8 or one of the relay FPC sheets 17 becomes defective, it can be isolated solely and readily. The workability in assembling or maintenance improves.

Spacers 35 in the drawings are included for fear the integrated circuits 20 and peripheral chips 21 may touch the face of the concave part 3a of the actuator 3, and are shaped like columns. In this embodiment, the concave part 3a is opposed to the surface of the printed-circuit board 16 on which the integrated circuits 20 are mounted, and accommodates the integrated circuits 20, spacers 35, and the like. Similarly to those in the aforesaid embodiments, the concave part 3a also plays a role of adjusting an unbalance of the actuator 3 caused by mounting the printed-circuit board 16 on the actuator 3.

(Fifth Embodiment)

Figure 11:
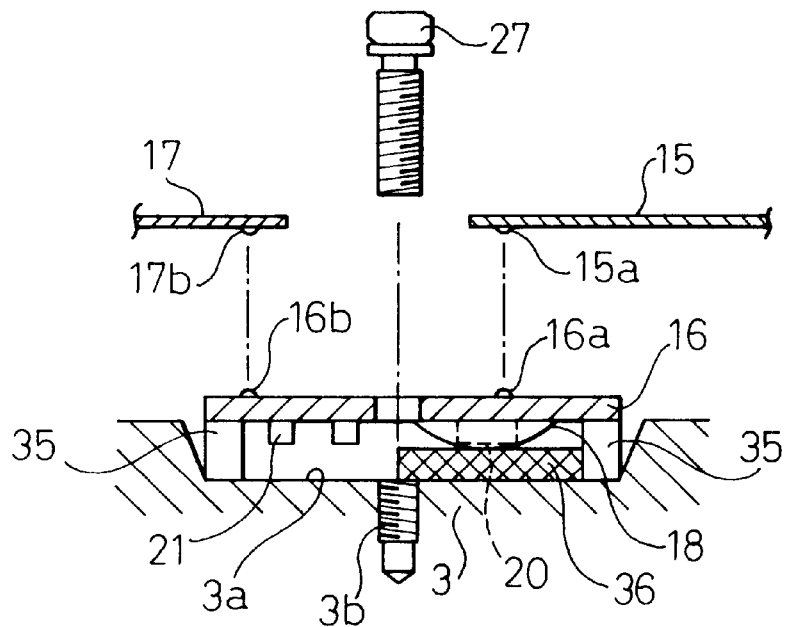
FIG. 11 is a sectional view showing the fifth embodiment.

FIG. 11 shows the fifth embodiment relating to an actuator for moving heads in a magnetic disk unit, conceptually illustrating a major portion thereof alone. In the drawing, parts corresponding to those in the fifth embodiment are assigned the same reference numerals. The upper presser board, lower presser board, and the like are omitted.

The fifth embodiment is based on the configuration of the fourth embodiment, wherein a gap between the integrated circuits 20 and the face of the concave part 3a of the actuator 3 is filled with a heat conductive member 36 made of rubber that is a material of high heat conductivity.

With the configuration, heat generated by the integrated circuits 20 can be dissipated efficiently via the actuator 3. A failure or the like in an integrated circuit 20 caused by a temperature rise can be avoided, the necessity of including a special heat dissipation part is obviated, and manufacturing cost can be reduced further. Even when the gap between the integrated circuits 20 and the face of the concave part 3a of the actuator 3 is filled with an adhesive made of a material of high heat conductivity or a resin but not with rubber, the same effect can be expected.

(Sixth Embodiment)

Figure 12:
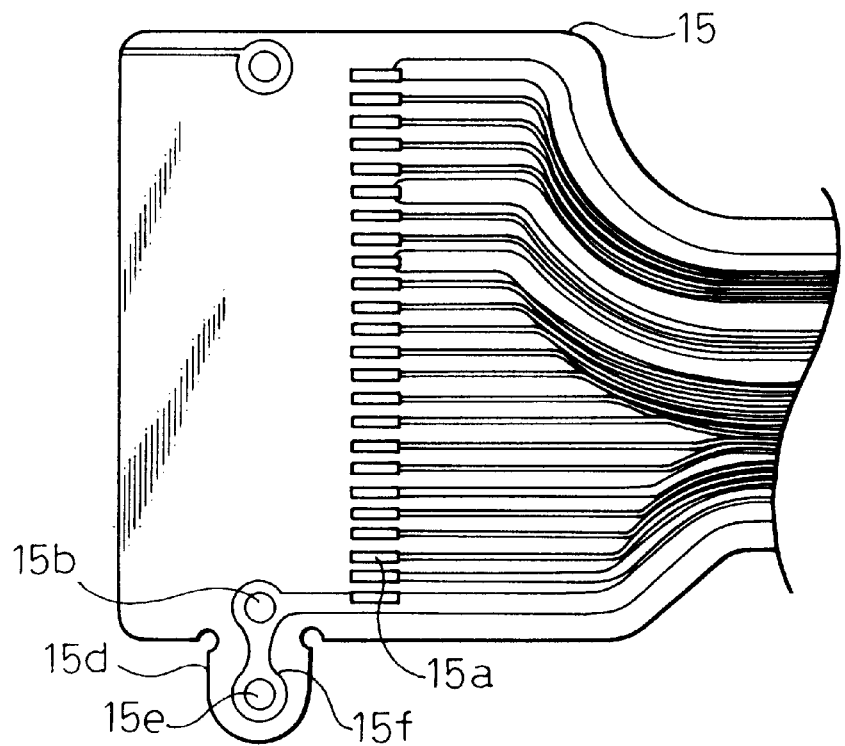
FIG. 12 is a partial plan view showing a main FPC sheet in the sixth embodiment.
Figure 13:
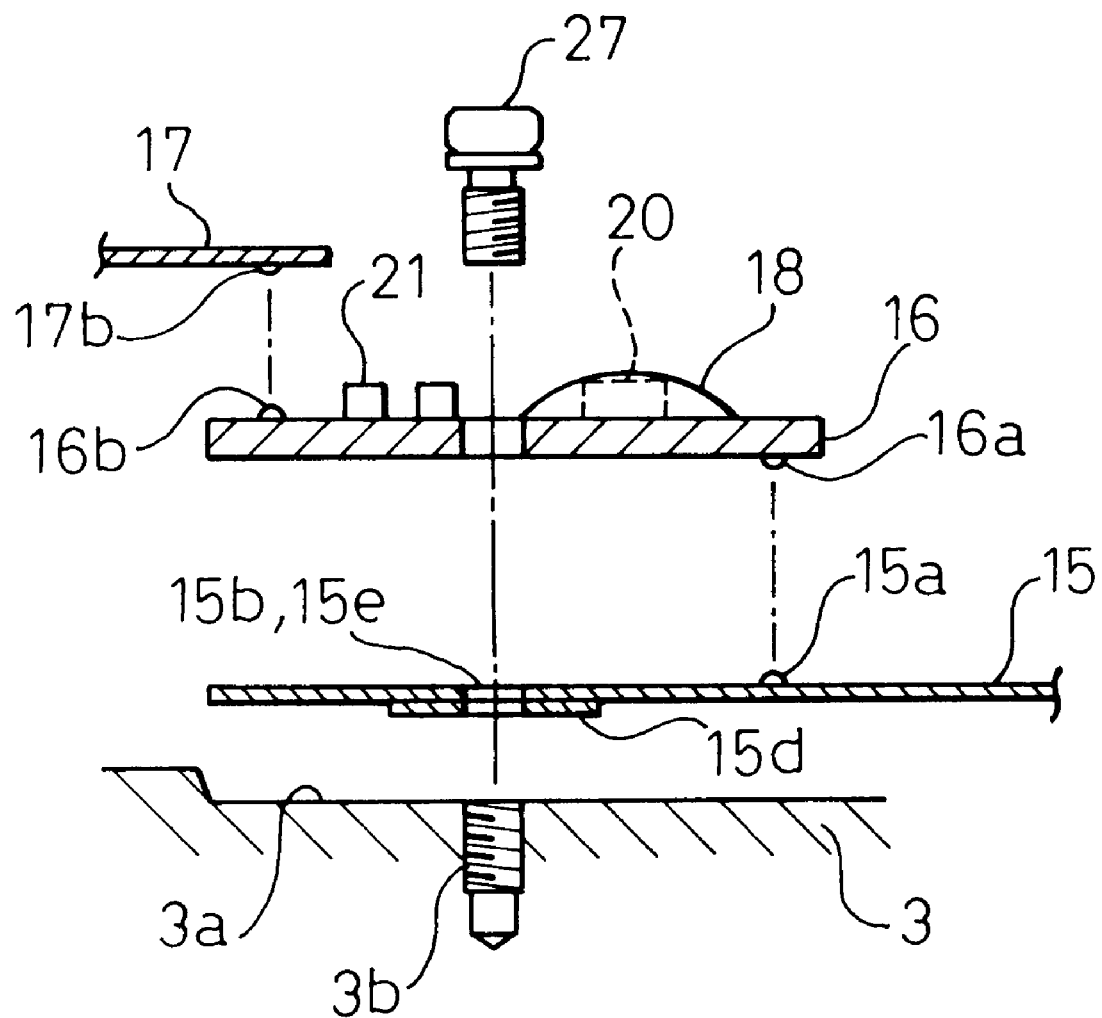
FIG. 13 is a sectional view showing a structure in the sixth embodiment.

FIGS. 12 and 13 show the sixth embodiment relating to an actuator for moving heads in a magnetic disk unit, conceptually illustrating a major portion thereof alone. In the drawings, parts corresponding to those in the first embodiment are assigned the same reference numerals. The upper presser board, lower presser board, and the like are omitted.

The sixth embodiment is configured in such a manner that: the main FPC sheet 15 is provided with a folded part 15d to be folded toward the actuator 3 during assembling and thus brought into contact with the face of the concave part 3a of the actuator 3; a grounded land 15f is formed on the perimeter of a through hole 15e (to be made coaxial to the through hole 15b during assembling) of the folded part 15d; and grounding is achieved through the contact of the land 15f with the face of the concave part 3a of the actuator 3.

With this configuration, the land 15f is elastically pressed to the face of the concave part 3a of the actuator 3. Grounding can be achieved at low cost reliably. Herein, the concave part 3a is, like those in the aforesaid embodiments, formed in consideration of an imbalance of the actuator 3 caused by mounting the printed-circuit board 16 on the actuator 3 so that the concave part 3a can adjust for the unbalance.

(Other Embodiment)

The aforesaid first to sixth embodiments relate to a magnetic disk unit. The present invention can be adapted to an optical disk unit in the same manner. This is attributable to the fact that even in an optical disk unit, heads for reading or writing data (optical heads) are supported by arms of an actuator, and there is a device for driving the actuator so that the heads move in a direction in which they traverse tracks on the disks.

In the optical disk unit, integrated circuits for processing output signals of photodetectors in the heads are mounted on a printed-circuit board. The printed-circuit board and a circuit unit in a body of the disk unit are electrically connected via a main FPC sheet. The printed-circuit board and heads are electrically connected via relay FPC sheets.

The optical heads are each provided with coils for tracking and focusing. It is necessary to supply a driving current to the coils. Leads for supplying the current can be formed on the main FPC sheet and relay FPC sheets.

As described above, in the present invention, a printed-circuit board is included to be supported by an actuator, electrically connected to a circuit unit in a body of a disk unit via a main FPC sheet, and electrically connected to heads via relay FPC sheets. Integrated circuits are mounted on the printed-circuit board. Incidentally, it is easy to form patterns on a printed-circuit board in a multilayered form at high density so as to produce a multilayered printed-wiring board. According to the present invention, a mounting area can be expanded substantially. It becomes unnecessary to fold the main FPC sheet for the purpose of expanding the mounting area.

Moreover, the rigidity of the printed-circuit board can be improved, and the work of mounting integrated circuits on the printed-circuit board is simple. According to the present invention, therefore, a part for retaining the main FPC sheet in a folded state is unnecessary, assembling work is simplified, and the manufacturing cost can be reduced.

Moreover, according to the present invention, since the main FPC sheet is not folded, signal transmission paths can be shortened. Furthermore, the employment of the printed-circuit board makes it possible to expand the mounting area more substantially. A larger number of peripheral chips and the like can therefore be mounted on the printed-circuit board on the actuator and an anti-noise characteristic can be improved. Besides, a shield layer or the like can be formed on the printed-circuit board readily. Even from this viewpoint, the anti-noise characteristic can be improved.

If a ceramic substrate is used as the printed-circuit board, heat generated by the integrated circuits can be transmitted to the actuator successfully. An excessive temperature rise in an integrated circuit can be avoided, and occurrence of dust or the like can be prevented.

Furthermore, if an FPC sheet having lands for electrical connection formed along an edge thereof is used as the main FPC sheet, FPC sheets having lands to be joined with the lands on the main FPC sheet formed are used as the relay FPC sheets, and the printed-circuit board is placed on the main FPC sheet, this results in a structure in which the relay FPC sheets and main FPC sheet which are all flat are connected mutually and the printed-circuit board is placed on the main FPC sheet. Consequently, assembly is simplified. This leads to a reduction in manufacturing cost.

If FPC sheets having lands for electrical connection with the printed-circuit board formed are used as the main FPC sheet and relay FPC sheets, and a printed-circuit board having lands to be joined with the lands on the relay FPC sheets formed on a surface thereof on which the integrated circuits are mounted and lands to be joined with the lands on the main FPC sheet formed on the surface thereof opposite to the surface on which the integrated circuits are mounted is used as the printed-circuit board, compared with the arrangement in which the relay FPC sheets and printed-circuit board are juxtaposed on the main FPC sheet, a wider printed-circuit board can be used as the printed-circuit board.

If FPC sheets having lands for electrical connection with the printed-circuit board formed are used as the main FPC sheet and relay FPC sheets, a printed-circuit board having lands to be joined with the lands on the main FPC sheet and relay FPC sheets formed on a surface thereof opposite to a surface thereof on which integrated circuits are mounted is used as the printed-circuit board, the mounting area of the printed-circuit board can be further widened.

With this configuration, if the printed-circuit board is placed so that the surface of the printed-circuit board on which the integrated circuits are mounted is opposed to the face of the actuator, the relay FPC sheets are located on the face side of the actuator. If one of the heads or relay FPC sheets is found defective, it can be isolated solely and readily. The workability in assembly or maintenance improves.

In addition, if the gap between the integrated circuits and actuator is filled with a material of high heat conductivity, heat generated by the integrated circuits can be dissipated efficiently. A failure in an integrated circuit caused by a temperature rise can be avoided, the necessity of including a special heat dissipation part is obviated, and the manufacturing cost can be reduced.

Furthermore, if a grounded land is formed on the main FPC sheet and then brought into contact with the face of the actuator, grounding can be achieved at low manufacturing cost. This contributes to a reduction in manufacturing cost.

What is claimed is:

1. A disk apparatus, comprising:

at least one disk;

a disk drive for rotating said disk;

at least one head for reading or writing data from or on recording surfaces of said disk;

an actuator having at least one arm for supporting said head;

an actuator drive for driving said actuator so that said head moves in a direction to traverse tracks on said disk;

a main FPC sheet having one end supported by said actuator and another end supported by a body of said disk apparatus, said main FPC sheet bending with oscillation of said actuator;

a relay FPC sheet placed along said arm of said actuator, and electrically connected to said head; and a rigid printed-circuit board mounted on said actuator and having a first side adapted for mounting integrated circuits thereon, and an opposing second side adapted for attaching at least one of said main FPC sheet and said relay FPC sheet thereto the other of said at least of said main FPC sheet and said relay FPC sheet being electrically connected to said integrated circuits and, said integrated circuits processing at least signals received from said head through said relay FPC sheet and sending resultant signals to said main FPC sheet.

2. An apparatus according to claim 1, wherein a ceramic substrate is used as said printed-circuit board.

3. An apparatus according to claim 1, wherein said main FPC sheet is attached to said second side of said printed-circuit board and further includes an edge and lands for electrical connection formed along said edge, and said relay FPC sheet further includes lands to be joined with said lands on said main FPC sheet.

4. An apparatus according to claim 1, wherein said main FPC sheet and said relay FPC sheet include lands for electrical connection with said printed-circuit board, and said printed-circuit board has lands formed on said first surface of said printed-circuit board on which said integrated circuits are mounted for electrically connecting with said lands on said relay FPC sheet, and lands formed on said opposing second surface of said printed-circuit board for electrically connecting with said lands on said main FPC sheet.

5. An apparatus according to claim 1, wherein said main FPC sheet and said relay FPC sheet are both attached to said second side of said printed-circuit board and further include lands for electrical connection with said printed-circuit board, and said printed-circuit board further includes lands formed on said second side for electrically connecting to said lands on said main FPC sheet and said relay FPC sheet.

6. An apparatus according to claim 5, wherein said printed-circuit board is placed so that said first surface of said printed-circuit board on which said integrated circuits are mounted is opposed to the face of said actuator.

7. An apparatus according to claim 6, wherein a gap between said integrated circuits and a face of said actuator is filled with a material of high heat conductivity.

8. An apparatus according to claim 1, wherein a grounded land is formed on said main FPC sheet and then brought into contact with a face of said actuator.

* * * * *

UNITED STATES PATENT AND TRADEMARK OFFICE
CERTIFICATE OF CORRECTION

PATENT NO.    : 6,021,025
DATED         : February 1, 2000
INVENTOR(S)   : Komura et al.

It is certified that error appears in the above-identified patent and that said Letters Patent is hereby corrected as shown below:

<u>Title page,</u>
Item [56], under "References Cited, U.S. PATENT DOCUMENTS", please delete "5,095,396 3/1992 Putnam et al. . . .360/106"

Under "[57], ABSTRACT"
Please delete the ABSTRACT in its entirety, and insert -- A disk apparatus includes an actuator having at least one arm for supporting at least one head and an actuator drive for driving the actuator. Also included is a main FPC sheet having one end supported by the actuator and another end supported by a body of the disk apparatus. The main FPC sheet is adapted to bend with oscillation of the actuator. A relay FPC sheet is placed along the arm of the actuator and electrically connected to the head. A rigid printed-circuit board is mounted on the actuator and has a first side adapted for mounting integrated circuits thereon, and an opposing second side adapted for attaching at least one of the main FPC sheet or the relay FPC sheet thereto. The other of the main FPC sheet or the relay FPC sheet is electrically connected to the integrated circuits. The integrated circuits processes the signals received from the head through the relay FPC sheet and sends the resultant signals to the main FPC sheet. --

Signed and Sealed this

Eighteenth Day of June, 2002

Attest:

*Attesting Officer*

JAMES E. ROGAN
*Director of the United States Patent and Trademark Office*